United States Patent
Galy et al.

(10) Patent No.: US 9,991,173 B2
(45) Date of Patent: Jun. 5, 2018

(54) BIDIRECTIONAL SEMICONDUCTOR DEVICE FOR PROTECTION AGAINST ELECTROSTATIC DISCHARGES

(71) Applicant: STMicroelectronics SA, Montrouge (FR)

(72) Inventors: Philippe Galy, Le Touvet (FR); Johan Bourgeat, Saint Pierre d'allev (FR)

(73) Assignee: STMicroelectronics SA, Montrouge (FR)

( * ) Notice: Subject to any disclaimer, the term of this patent is extended or adjusted under 35 U.S.C. 154(b) by 0 days. days.

(21) Appl. No.: 14/155,891

(22) Filed: Jan. 15, 2014

(65) Prior Publication Data

US 2014/0197448 A1    Jul. 17, 2014

(30) Foreign Application Priority Data

Jan. 15, 2013   (FR) ..................................... 13 50323

(51) Int. Cl.
*H01L 21/8249*   (2006.01)
*H01L 29/747*   (2006.01)
(Continued)

(52) U.S. Cl.
CPC ...... *H01L 21/8249* (2013.01); *H01L 27/0262* (2013.01); *H01L 29/0692* (2013.01); *H01L 29/747* (2013.01); *H01L 29/87* (2013.01)

(58) Field of Classification Search
CPC .......................... H01L 29/747; H01L 21/8249
See application file for complete search history.

(56) References Cited

U.S. PATENT DOCUMENTS 5,324,966 A * 6/1994 Muraoka et al. ............. 257/136
5,345,357 A * 9/1994 Pianka ............................ 361/56
(Continued)

FOREIGN PATENT DOCUMENTS

EP    2246885 A1    11/2010
EP    2290691 A1    3/2011
(Continued)

OTHER PUBLICATIONS

Bourgeat, et al., "TCAD study of the impact of trigger element and topology on Silicon Controlled Rectifier turn-on behavior," 2010 32nd Electrical Overstress/ Electrostatic Discharge Symposium, Oct. 3, 2010-Oct. 8, 2010, 10 pages.
(Continued)

Primary Examiner — Thao X Le
Assistant Examiner — Xia Cross
(74) Attorney, Agent, or Firm — Slater Matsil, LLP (57) ABSTRACT

An integrated circuit is produced on a bulk semiconductor substrate in a given CMOS technology and includes a semiconductor device for protection against electrostatic discharges. The semiconductor device has a doublet of floating-gate, thyristors coupled in parallel and head-to-tail. Each thyristor has a pair of electrode regions. The two thyristors respectively have two separate gates and a common semiconductor gate region. The product of the current gains of the two transistors of each thyristor is greater than 1. Each electrode region of at least one of the thyristors has a dimension, measured perpendicularly to the spacing direction of the two electrodes of the corresponding pair, which is adjusted so as to impart to the thyristor an intrinsic triggering voltage less than the breakdown voltage of a transistor to be protected, and produced in the CMOS technology.

17 Claims, 8 Drawing Sheets

(51) Int. Cl.
  *H01L 27/02* (2006.01)
  *H01L 29/87* (2006.01)
  *H01L 29/06* (2006.01)

(56) References Cited

U.S. PATENT DOCUMENTS

| | | | |
|---|---|---|---|
| 5,880,488 | A | 3/1999 | Yu |
| 6,226,162 | B1 | 5/2001 | Kladar et al. |
| 6,236,087 | B1 | 5/2001 | Daly et al. |
| 6,512,662 | B1* | 1/2003 | Wang .............................. 361/56 |
| 6,594,132 | B1 | 7/2003 | Avery |
| 6,621,108 | B2* | 9/2003 | Tashiro et al. ................. 257/173 |
| 6,639,779 | B2 | 10/2003 | Knigge et al. |
| 6,765,771 | B2 | 7/2004 | Ker et al. |
| 2002/0041007 | A1 | 4/2002 | Russ |
| 2003/0076640 | A1 | 4/2003 | Malherbe et al. |
| 2004/0027744 | A1 | 2/2004 | Liu et al. |
| 2004/0207021 | A1 | 10/2004 | Russ et al. |
| 2006/0011939 | A1 | 1/2006 | Mohn et al. |
| 2006/0209478 | A1 | 9/2006 | Arai et al. |
| 2007/0262386 | A1 | 11/2007 | Gossner et al. |
| 2008/0044955 | A1 | 2/2008 | Salcedo et al. |
| 2008/0218919 | A1 | 9/2008 | Galy et al. |
| 2010/0027174 | A1 | 2/2010 | Galy et al. |
| 2010/0157491 | A1* | 6/2010 | Hong ............... H03K 17/08122 361/56 |
| 2010/0271740 | A1 | 10/2010 | Galy et al. |
| 2010/0271741 | A1 | 10/2010 | Galy et al. |
| 2011/0042747 | A1 | 2/2011 | Galy et al. |
| 2011/0068366 | A1 | 3/2011 | Huang |
| 2011/0234743 | A1* | 9/2011 | Nagumo ....................... 347/224 |
| 2012/0050925 | A1 | 3/2012 | Galy et al. |
| 2012/0069478 | A1* | 3/2012 | Caplan ............... H01L 27/0292 361/56 |
| 2012/0199912 | A1* | 8/2012 | Flachowsky et al. ........ 257/365 |
| 2012/0275075 | A1* | 11/2012 | Dray .................. H01L 27/0262 361/56 |
| 2012/0286321 | A1* | 11/2012 | Galy .................. H01L 27/0262 257/119 |
| 2012/0319204 | A1 | 12/2012 | Benoist et al. |
| 2013/0113017 | A1 | 5/2013 | Galy et al. |
| 2013/0121087 | A1* | 5/2013 | Liaw ..................... G11C 11/413 365/189.05 |
| 2013/0141824 | A1 | 6/2013 | Bourgeat et al. |
| 2013/0155558 | A1 | 6/2013 | Bourgeat et al. |
| 2013/0214326 | A1 | 8/2013 | Galy et al. |

FOREIGN PATENT DOCUMENTS

| | | |
|---|---|---|
| FR | 2838881 A1 | 10/2003 |
| FR | 2974685 A1 | 11/2012 |
| FR | 2975224 A1 | 11/2012 |
| WO | 02075892 A1 | 9/2002 |

OTHER PUBLICATIONS

Kehan, et al., "Design Analysis of a Novel Low Triggering Voltage Dual Direction SCR ESD Device in 0.18 μm Mixed Mode RFCMOS Technology," Journal of Semiconductors, Vo. 29, No. 11, Nov. 2008, 6 pages.

Shi, et al., "Design and Analysis of Low-Voltage Silicon-Controlled Rectifier ESD Protection Circuit," 2010 IEEE International Conference Electron Devices and Solid-State Circuits, Dec. 15, 2010- Dec. 17, 2010, 4 pages.

Vashchenko, et al., "Multi-Port ESD Protection Using Bi-Directional SCR Structures," IEEE BCTM 7.4, Downloaded on Sep. 21, 2009, 8 pages.

* cited by examiner

BIDIRECTIONAL SEMICONDUCTOR DEVICE FOR PROTECTION AGAINST ELECTROSTATIC DISCHARGES

This application claims priority to French Patent Application No. 1350323, which was filed Jan. 15, 2013 and is incorporated herein by reference.

TECHNICAL FIELD

The invention relates to integrated circuits and, in particular embodiments, to bidirectional semiconductor devices for protection against electrostatic discharges (ESD). For example, the devices can be produced in a CMOS technology in a bulk silicon substrate and can be usable without a triggering circuit.

BACKGROUND

In the field of microelectronics, an electrostatic discharge can occur throughout the lifetime of an integrated circuit, and can constitute a genuine problem for the reliability of this integrated circuit, as well as a major cause of malfunction.

An electrostatic discharge is generally manifested by a current peak of varying amplitude and varying duration.

An ESD protection device should therefore remove this current peak. Furthermore, this current peak induces a thermal stress in the protection device.

One conventional ESD protection element is a triac. The production of such a protective element in a technology of the bulk-substrate type readily makes it possible to dissipate the heat generated by the ESD pulse through the contacts and the bulk substrate in which the protective element is produced.

Furthermore, ESD protection devices of the triac type are generally associated with triggering circuits, for example, MOS transistors whose gate and substrate are connected to ground (GGNMOS transistors), connected to their gate. This presence of a triggering circuit makes it possible to reduce the triggering voltage of the protection device. The triggering voltage of such a device is the voltage applied between the two terminals of the device, beyond which the device starts to conduct. However, the presence of a triggering circuit has a negative effect on the surface size of the assembly.

In particular, when the protection device is produced in a given CMOS technology on a bulk substrate, moreover, the absence of a triggering circuit leads to high triggering voltages, which may be greater than the breakdown voltage of a transistor produced in the technology and capable of being protected by this protection device.

SUMMARY

According to one embodiment, an ESD protection device is provided. In particular, a triac produced in a given CMOS technology is usable without a triggering circuit and has a lower breakdown voltage than a conventional triac. In particular, the breakdown voltage is less than the breakdown voltage of a transistor produced in the technology and capable of being protected by this protection device.

Another parameter of an ESD protection device, in particular a triac, is its holding voltage, that is, the minimum voltage at which the device remains conductive after having been triggered.

According to another embodiment, an ESD protection device is provided. In particular a triac can be produced in a given CMOS technology, whether on a bulk substrate or on silicon-on-insulator (SOI), and be usable without a triggering circuit and have a higher holding voltage than a conventional triac.

According to one aspect, an integrated circuit produced on a bulk semiconductor substrate in a given CMOS technology comprises a protective semiconductor device intended to protect a component produced in the CMOS technology and having at least one MOS transistor against electrostatic discharges.

The protection device has a doublet of floating-gate thyristors connected in parallel and head-to-tail. Each thyristor has a pair of electrode regions. The two thyristors respectively have two separate gates and a common semiconductor gate region. The product of the current gains of the two transistors of each thyristor is greater than 1 and each electrode region of at least one of the thyristors has a dimension, measured perpendicularly to the spacing direction of the two electrodes of the corresponding pair, which is adjusted so as to impart to the thyristor an intrinsic triggering voltage less than the breakdown voltage of the at least one transistor of the component.

The two thyristors mounted head-to-tail make it possible to have a bidirectional protection device.

Furthermore, the common gate makes it possible to have a compact device.

It is also not necessary to have an external triggering element for triggering the device. This is because simple application of a potential to the anode or cathode of a thyristor leads to a thermodynamic imbalance of the device and distribution of the potential over the entire device, which biases the junctions allowing injection of minority or majority carriers, depending on the case, which sets the bipolar transistors of the device in conduction with, when the product of the current gains of the two transistors of each thyristor is greater than 1, amplification, sustained by positive feedback, of the base currents of the transistors, until operation of these transistors in saturated mode is obtained. Effective triggering of the device is then obtained, allowing it to efficiently fulfill its ESD protection function.

Furthermore, the Inventors have observed that adjustment of this dimension, measured perpendicularly to the spacing direction of the two electrodes and which may be referred to as the electrode width, makes it possible to adjust the triggering voltage of the thyristor in question. Increasing this electrode width also leads to a decrease in the triggering voltage of the thyristor.

Generally, in view of the bidirectional nature of the device, it is preferable for each electrode region of the two thyristors to have a dimension, measured perpendicularly to the spacing direction of the two electrodes of the corresponding pair, which is adjusted so as to impart to the two thyristors respective intrinsic triggering voltages less than the breakdown voltage of a transistor produced in the CMOS technology.

This being the case, it is possible to adjust the triggering voltages of the two thyristors identically or differently so as to have identical or different triggering voltages depending on the sign of the ESD pulse.

More particularly, according to an embodiment making it possible to have different triggering voltages for the two thyristors, the dimension of the electrode regions of one of the thyristors is different from the dimension of the electrode regions of the other thyristor.

By way of example, when the protection device is produced in a 28 nm or 32 nm CMOS technology, and the transistor to be protected is a transistor with a thick gate oxide, typically having a thickness of more than 3 nanometers, for example 6.5 nanometers, the dimension is advantageously greater than 6 microns.

This is because the breakdown voltage of such a transistor lies between 6 and 8 V. With a dimension of 6 microns, the triggering voltage of the protection device lies between 4 and 5 V.

According to one embodiment, the dimension of the common gate region, measured parallel to the spacing direction, is greater than the minimum dimension defined by the design rules of the technology.

This is because the Inventors have furthermore observed that adjustment of this common gate region dimension, which may be referred to as the gate length, makes it possible to adjust the holding voltage of the device. Increasing this gate length also leads to an increase in the holding voltage of the device.

This being the case, this characteristic may also be considered independently of the one relating to the electrode width.

In other words, according to another aspect an integrated circuit is provided, produced in a given CMOS technology, comprising a protective semiconductor device for protection against electrostatic discharges, having a doublet of floating-gate transistors connected in parallel and head-to-tail, each thyristor having a pair of electrode regions, the product of the current gains of the two transistors of each thyristor being greater than 1, and the two thyristors respectively having two separate gates and a common semiconductor gate region having a dimension, measured parallel to the spacing direction of the electrodes of each pair, greater than the minimum dimension defined by the design rules of the technology. These design rules are generally referred to by the person skilled in the art by the acronym DRM ("Design Rules Manual").

Increasing the electrode widths of a triac in order to reduce its bidirectional triggering voltages is valid when the triac is produced in a bulk-substrate technology or in an SOI technology. This being the case, in an SOI technology, the intrinsic triggering voltage (without a triggering circuit) of a triac is already very low. Lastly, in an SOI technology, and more particularly in an FDSOI technology, there may be up to six orders of magnitude difference between the concentration of dopants in an N+ region of a triac and that of an intrinsic P type region, which then leads to an extremely large depletion zone of the associated PN junction and therefore to almost absence of an energy step, which leads to triggering voltages that can be very low.

This is the reason why the increase of the electrode widths applies more particularly to a triac produced in a bulk-substrate technology, in which it intrinsically has a high triggering voltage.

On the other hand, increasing the gate length in order to increase the holding voltage is advantageous irrespective of the type of technology (bulk or SOI, for example).

Further to the increase of its length, the common gate region may also comprise at least one zone selected from the group formed by a zone having the same conductivity type as the common gate region but doped more heavily than the common gate region, a zone having the opposite conductivity type to the common gate region and optionally doped more heavily than the common gate region, an electrically insulating region.

This contributes to increasing the holding voltage.

More particularly, the common gate region may comprise three zones selected from the group, with two identical zones surrounding a different zone. For example, there may be a sequence of zones P+-N+-P+, or P+-insulator-P+.

BRIEF DESCRIPTION OF THE DRAWINGS

Other advantages and characteristics of the invention will become apparent on studying the detailed description of entirely nonlimiting embodiments and the appended drawings, in which FIGS. 1 to 14 schematically illustrate various embodiments of a device according to the invention.

DETAILED DESCRIPTION

Generally, in order to protect a component against electrostatic discharges (ESD), this component is connected to the two terminals of a protection device.

This component, produced in CMOS technology, generally comprises one or more MOS transistors.

When the component is not in operation, it may be subjected to an electrostatic discharge typically manifested by a very short current pulse.

It is then expedient for this current pulse to flow through the protection device and not through the component to be protected.

The device is consequently intended to absorb this current pulse and avoid overvoltages at the terminals of the component.

Such an ESD protection device is, for example, a triac.

Although the invention applies to any type of triac structure, a first example of a structure will now be described with reference more particularly to FIGS. 1 to 7.

More precisely, in this example, the triac TRC with a single common gate GH comprises (FIG. 1) a first semiconductor section CS1 having a first conductivity type, for example the N conductivity type, forming the common gate GH of the two thyristors of the triac. Two second semiconductor sections CS20 and CS21 have a second conductivity type, the opposite of the first, here the P conductivity type. These two sections CS20 and CS21 are arranged on either side of the first section CS1.

Figure 1:
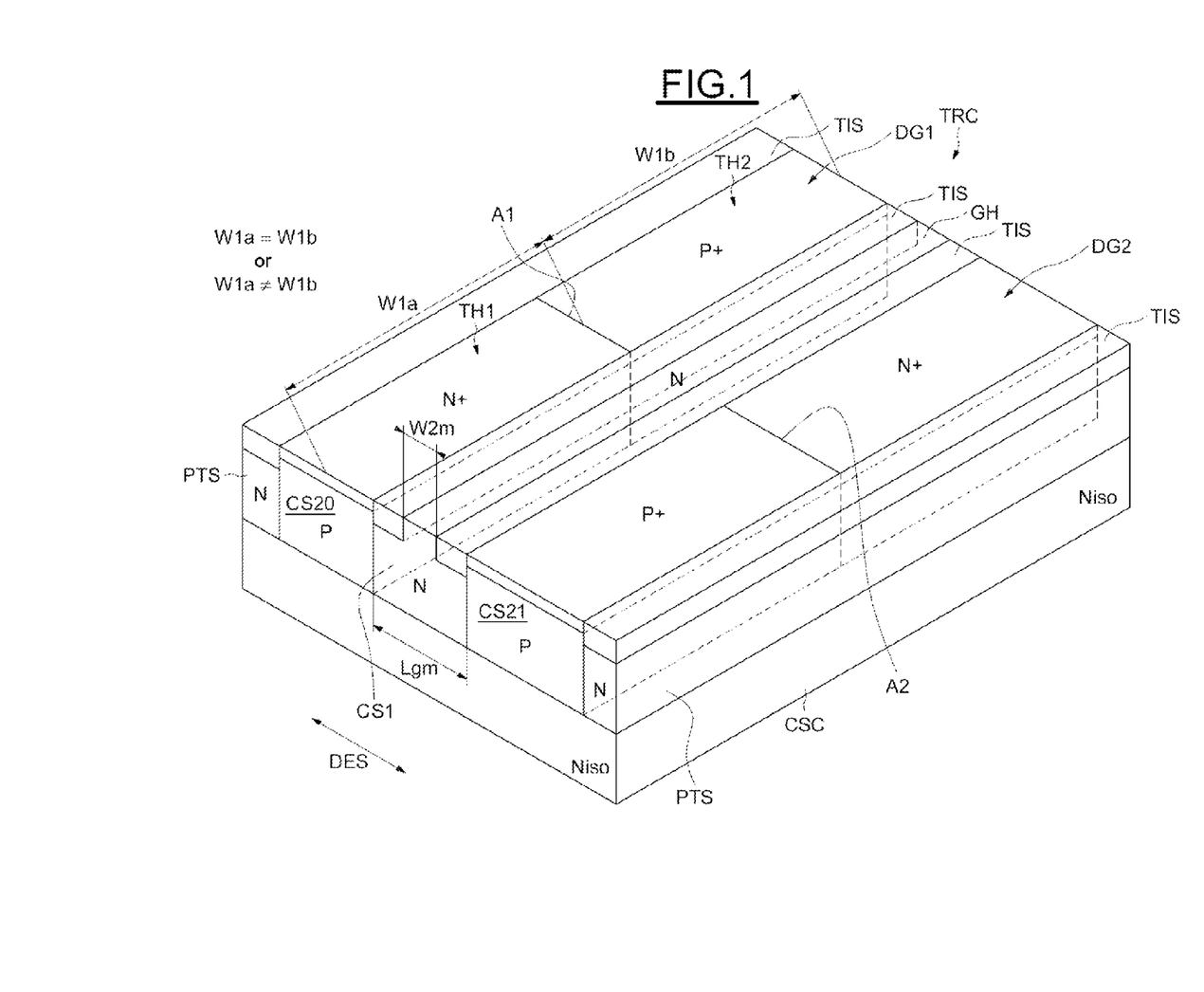

Furthermore, an N+ doped zone and a P+ doped zone, mutually in contact, both contact the section CS20 and form the electrode A1 of the triac TRC.

Likewise, a P+ doped zone and an N+ doped zone, mutually in contact, both contact the second section CS21 and form the second electrode A2 of the triac TRC.

The electrodes A1 and A2 of the triac then form the two terminals, between which the component to be protected will be connected.

The P+ and N+ zones are insulated from the first section CS1 by isolation trenches TIS of the shallow trench isolation type (STI).

Likewise, isolation trenches TIS laterally insulate the zones N+ and P+ of the triac TRC externally.

Each pair of mutually opposite zones (N+, P+) separated by the section CS1 forms, with the underlying P and N layers, a half-triac (thyristor).

Furthermore, a buried semiconductor layer CSC (N-doped and commonly referred to as a "Niso layer") contacts the first and second sections of the triac TRC. N-doped wells PTS are arranged laterally with respect to the sections CS20 and CS21 and contact the buried layer CSC. This buried layer is itself arranged in a P section (not represented for the sake of simplicity).

The triac, which is a double P-N-P-N structure, therefore in this case comprises two fingers DG1, DG2 respectively produced in an integrated fashion within the semiconductor sections mentioned above.

The two thyristors TH1 and TH2 are connected head-to-tail, have floating gates and have a common floating semiconductor CS1 gate N region. Furthermore, the thyristor TH1 has a floating gate P (section CS20) separate from the floating gate P (section CS21) of the thyristor TH2.

In the case in which the anode P+ of the thyristor TH2 is set at a positive potential relative to ground, a thermodynamic imbalance is then created in the thyristor, which causes distribution of the potential over the entire thyristor, which biases the PN junctions and consequently allows injection of minority carriers (here electrons), which sets the bipolar transistors of the thyristor in conduction.

In the case in which a negative potential relative to ground is applied to the anode of the thyristor TH2, and consequently to the cathode of the thyristor TH1. There is also distribution of the potential over the entire thyristor TH1, which biases the junctions and allows injection of minority carriers (here holes), which sets the bipolar transistors of the thyristor THi1 in conduction.

More precisely, in either case, in view of the structure with two looped transistors of a thyristor, the injection of carriers at the base of one of the transistors of the thyristor leads, when the product of the current gains (gains β) of the two transistors of the thyristor is greater than 1, to a sustained positive feedback loop being obtained, causing amplification of the base current injected into each of the transistors of the thyristor and leading to operation of the transistors of the thyristor in saturated mode.

W1a denotes the electrode width of the thyristor TH1 (measured perpendicularly to the spacing direction DES of the electrodes) and W1b denotes the electrode width of the thyristor TH2 (measured perpendicularly to the spacing direction DES of the electrodes).

In this example, W1a is equal to W1b, although these two values may be different in order to make the response of the device non-symmetrical.

The triac TRC is produced here in a 28 nm or 32 nm CMOS bulk-substrate technology, and the transistor or transistors of the component protected by this triac are MOS transistors produced in this technology and having thick gate oxides, typically larger than 3 nanometers.

In such technologies, the breakdown voltage of such a thick gate oxide transistor is of the order of 6 to 8 volts.

Furthermore, the widths W1a0 and W1b0 are conventionally of the order of 3 microns in such technologies, which leads to intrinsic triggering voltages (without a triggering circuit) of the order of 7 volts.

The curve CV0 (FIG. 2) is a conventional graph of positive current and voltage of a triac having a triggering voltage VDC and a holding voltage VH (the graph would be similar on the negative side).

Figure 2:
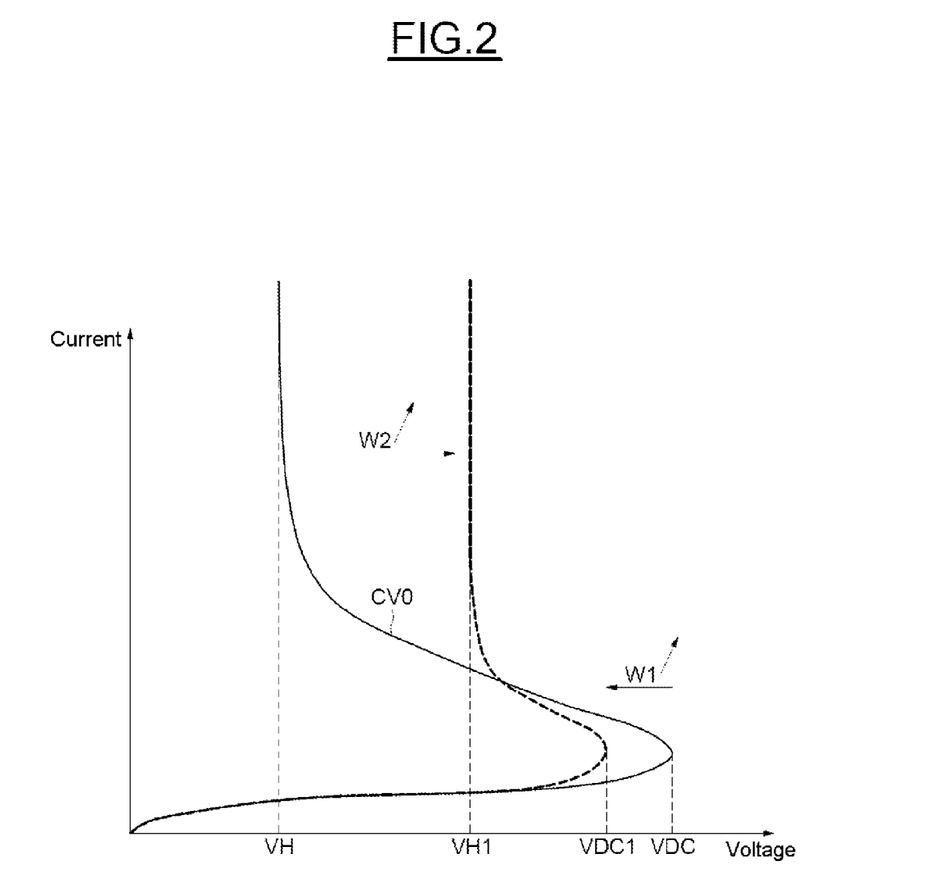

When W1a0 and W1b0 are increased in order to obtain the values W1a and W1b, the triggering voltage of the triac is reduced so as to obtain a value VDC1 lower than VDC (it is assumed here that W1a and W1b remain equal, leading to identical triggering voltages irrespective of the sign of the ESD pulse).

This makes it possible to reduce the triggering voltage by the order of 1 to a few volts.

By way of indication, in 28 nm and 32 nm CMOS technologies, the widths W1a and W1b are selected to be greater than or equal to 6 microns. With 6 microns, a decrease in the triggering voltage of the order of 2 volts is obtained, and it then lies between 4 and 5 V.

In FIG. 1, W2m denotes the length of the common gate region GH measured parallel to the spacing direction between the two regions TIS, and Lgm denotes the dimension of the common gate region measured parallel to the spacing direction between the two sections CS20 and CS21.

W2m and Lgm are the minimum dimensions dictated by the design rules (DRM) of the technology in question.

Thus, for a 28 nm CMOS technology, W2m is equal to 0.129 micron and Lgm is equal to 0.227 micron, and the holding voltage VH is of the order of 1.2 volts.

For a 32 nm CMOS technology, W2m is equal to 0.148 micron and Lgm is equal to 0.26 micron, and the holding voltage VH is of the order of 1.2 volts.

As illustrated in FIG. 2, when W2 and consequently Lg are increased (FIG. 3), the holding voltage is increased, its value changing from VH to VH1.

Figure 3:
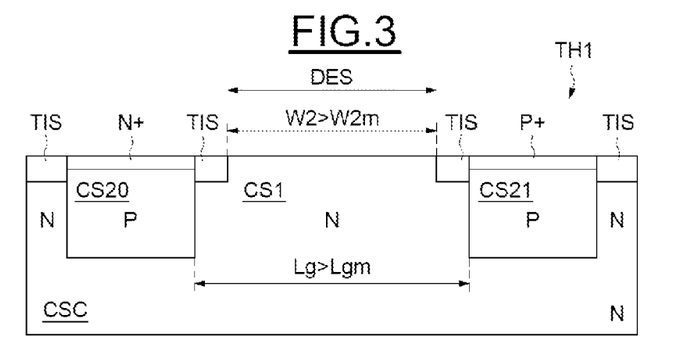

Thus, for a 28 nm CMOS technology and with a value W2 equal to 2 microns, a holding voltage VH1 of the order of 1.7 volts is obtained.

Naturally, if W1 and W2 are increased at the same time, the two effects mentioned above are combined.

Whereas the embodiment of FIG. 3 only had a length increase of the common gate region, it is possible to insert into this common gate region at least one zone selected from the group formed by a zone having the same conductivity type as the common gate region but doped more heavily than the common gate region, a zone having the opposite conductivity type to the common gate region and optionally doped more heavily than the common gate region, an electrically insulating region.

The holding voltage of the triac can then be increased further.

Examples of such alternative embodiments are illustrated in FIGS. 4 to 7.

Figure 4:
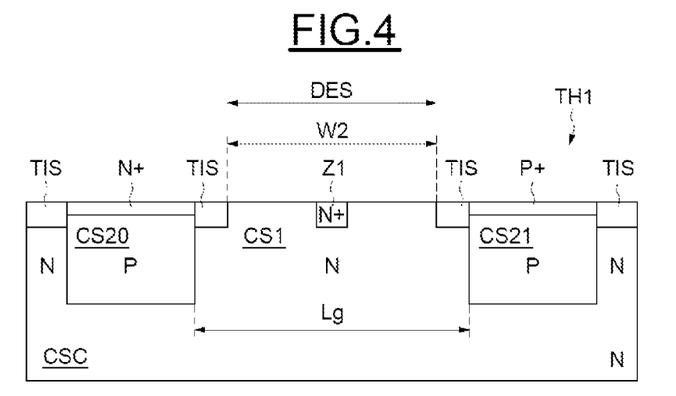

Thus, in FIG. 4, the common gate region CS1 comprises an N+ doped zone Z1, that is to say of the same conductivity type as the common gate region but more heavily doped. Such a zone modifies the acceleration field of the carriers in the direction of braking and, by the increase in the concentration of dopants, the recombination of minority carriers is increased, which contributes to increasing the holding voltage.

Figure 5:
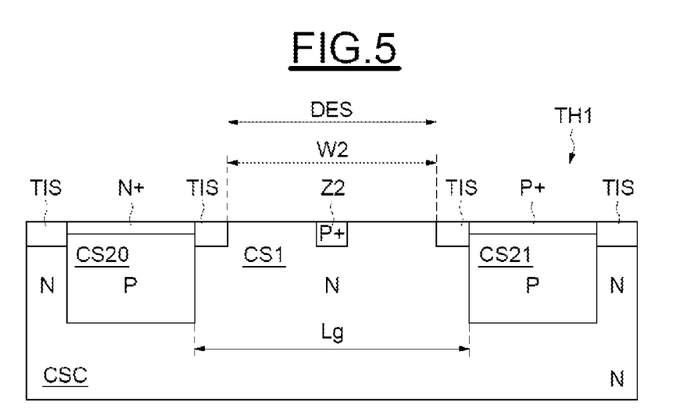

In FIG. 5, the common gate region CS1 comprises a P+ doped zone Z2, that is to say of the opposite conductivity type to the common gate region, and here more heavily doped, although the greater nature of the doping is not essential. Such a zone increases the recombination of the minority carriers by increasing the mean free path due to the space charge zone, and therefore contributes to increasing the holding voltage.

Figure 6:
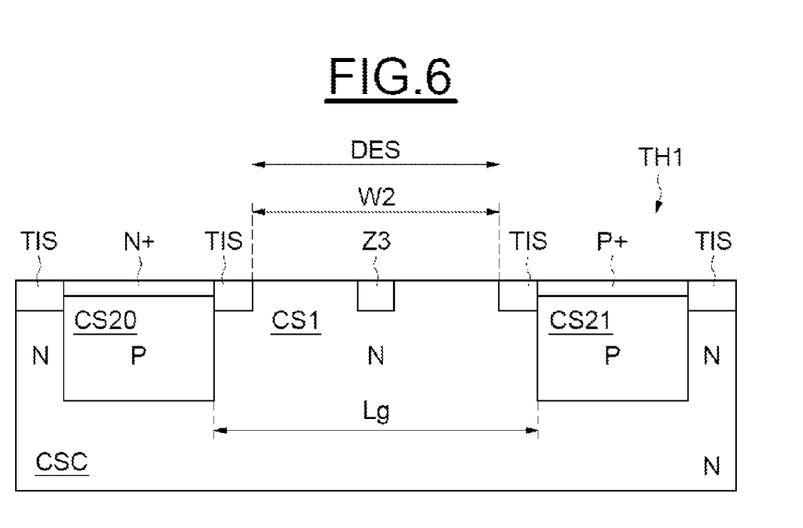

In FIG. 6, the common gate region CS1 comprises an insulating zone Z3, for example of the shallow trench type. Such a zone increases the mean free path of topological nature of the carriers, which increases the recombination of the minority carriers and contributes to increasing the holding voltage.

Figure 7:
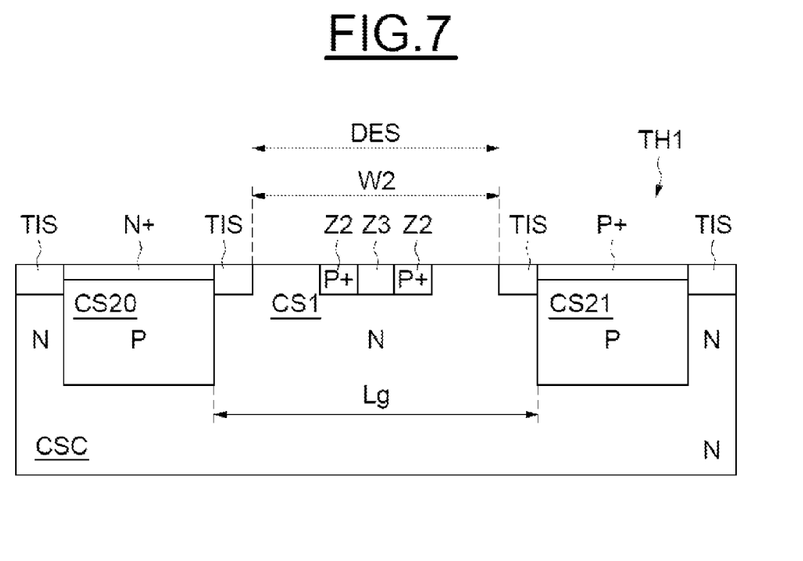

It is also possible, as illustrated in FIG. 7, for the common gate region to comprise three zones selected from the group of zones mentioned above, with two identical zones surrounding a different zone. This makes it possible to combine the effects mentioned above.

More precisely, in FIG. 7 there is a sequence of zones Z2-Z3-Z2.

Figure 8:
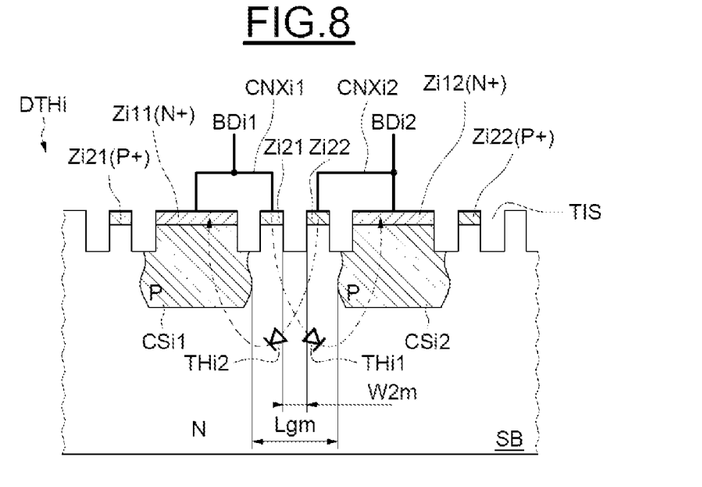

Reference will now be made more particularly to FIG. 8 onwards in order to describe other embodiments of the protection device according to the invention.

In FIG. 8, the reference DTHi denotes a doublet of two thyristors THi1 and THi2, connected in parallel and mounted head-to-tail so as to form a triac, of which the gates of the two transistors are floating gates.

More precisely, the device comprises a common semiconductor layer SB, here having the N conductivity type. This layer is an N section implanted in a P bulk substrate.

The doublet DTHi of thyristors is formed in and above the semiconductor layer SB.

More precisely, two sections CSi having the P conductivity type are produced in the layer SB, for example by implantation.

These two sections are mutually spaced.

In contact with the two sections CSi1 and CSi2, two first semiconductor zones Zi11 and Zi12 are respectively produced by implantation, these two first zones being N+ doped.

Furthermore, a P+ doped second semiconductor zone Zi21, also produced by implantation in the layer SB, surrounds the first semiconductor zone Zi11 and is electrically insulated from this zone Zi11 by an isolation trench TIS.

Likewise, a second semiconductor zone Zi22, also P+ doped, surrounds the first semiconductor zone Zi12 and is insulated therefrom by an isolation trench TIS.

An electrical connection CNXi1, for example a metallization of the first metal level (metal M1) of the integrated circuit, electrically connects the first semiconductor zone Zi11 and the second semiconductor zone Zi21 above the layer SB.

Likewise, an electrical connection CNXi2 (also at the metal level M1, for example) connects the first semiconductor zone Zi12 and the second semiconductor zone Zi22.

It can therefore be seen that the doublet DTHi comprises a first thyristor THi1 of the PNPN type.

More precisely, the anode P of the thyristor THi1 is formed by the second semiconductor zone Zi21 and the cathode of this thyristor is formed by the first semiconductor zone Zi12.

The thyristor comprises a gate N and a gate P. The gate N is formed by the layer SB whereas the gate P is formed by the section CSi2.

The second thyristor THi2 is also of the PNPN type. Its anode is formed by the second semiconductor zone Zi22, and its cathode is formed by the first semiconductor zone Zi11. The second thyristor also has a gate N and a gate P. The gate N of the thyristor THi2 is also formed by the layer SB, and is therefore common with the gate N of the thyristor THi1.

The gate P of the thyristor THi2 is formed by the section CSi1, and is separate from the gate P of the thyristor THi1.

The gates P of the thyristors and the common gate N are floating gates.

Owing to the electrical connections CNXi1 and CNXi2, the anode of the thyristor THi1 is electrically connected to the cathode of the thyristor THi2, and the anode of the thyristor THi2 is electrically connected to the cathode of the thyristor THi1.

A first terminal BDi1 of the thyristor doublet DTHi is formed by the anode of the thyristor THi1 and the cathode of the thyristor THi2.

The second terminal BDi2 of the doublet DTHi is formed by the anode of the thyristor THi2 and the cathode of the thyristor THi1.

The terminals BDi1 and BDi2 then form the two terminals between which the component to be protected will be connected.

The operation of the device of FIG. 8 is similar to that of the device of FIG. 1.

Thus, in the case in which the second terminal BDi2, and consequently the anode of the thyristor THi2, is set at a positive potential relative to ground, a thermodynamic imbalance is then created in the thyristor, which causes distribution of the potential over the entire thyristor, which biases the PN junctions and consequently allows injection of minority carriers (here electrons), which sets the bipolar transistors of the thyristor in conduction.

In the case in which a negative potential relative to ground is applied to the terminal BDi2, and consequently to the cathode of the thyristor THi1, there is also distribution of the potential over the entire thyristor THi1, which biases the junctions and allows injection of minority carriers (here holes), which sets the bipolar transistors of the thyristor THi1 in conduction.

More precisely, in either case, in view of the structure with two looped transistors of a thyristor, the injection of carriers at the base of one of the transistors of the thyristor leads, when the product of the current gains (gains β) of the two transistors of the thyristor is greater than 1, to a sustained positive feedback loop being obtained, causing amplification of the base current injected into each of the transistors of the thyristor and leading to operation of the transistors of the thyristor in saturated mode.

Figure 9:
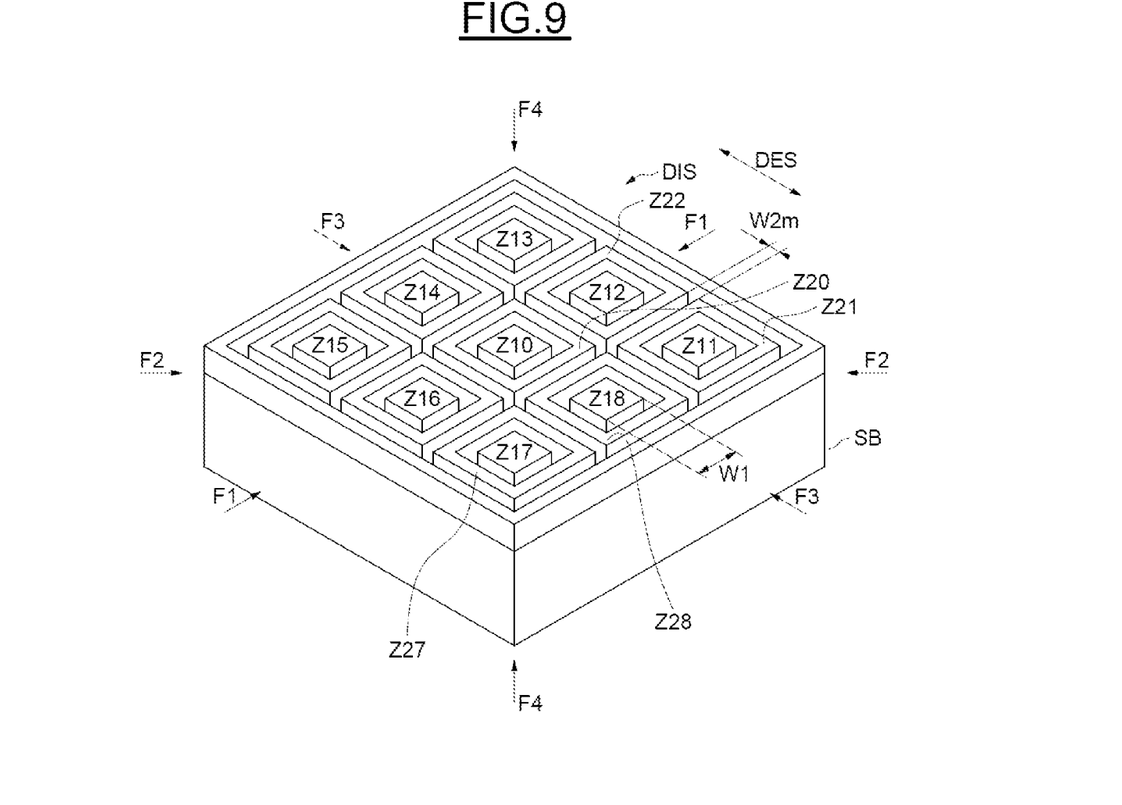

The device DIS illustrated in FIG. 9 makes it possible to protect eight nodes of an integrated circuit against ESD pulses.

It is a particularly compact structure of eight doublets of thyristors DTH1-DTH8 arranged in a matrix network, here having three rows and three columns of first semiconductor zones $Z1k$ respectively surrounded by their second semiconductor zones $Z2k$, to which they are respectively connected electrically by metallizations.

More precisely, the central first semiconductor zone Z10, surrounded by the corresponding second semiconductor zone Z20 and arranged in contact with the corresponding underlying section, are common to all the thyristors, and the central first semiconductor zone Z10 electrically connected to the second zone Z20 forms the first terminal of the device DIS intended to be connected to ground.

The other first semiconductor zones Z11-Z18, surrounded by their second zones Z21-Z28 and located in the immediate vicinity of the common central second zone Z20, respectively form the eight second terminals of the device, and are respectively intended to be connected to the eight nodes to be protected. Eight components respectively connected between the eight nodes and ground can thus be protected.

The device DTHi illustrated in section in FIG. 8 is, for example, the one which in FIG. 9 comprises the zones Z10 and Z18 (cathodes of the two thyristors) respectively surrounded by the zones Z20 and Z28 (anodes of the two thyristors).

W1 denotes the electrode width of the thyristors (measured perpendicularly to the spacing direction DES of the electrodes).

The triac TRC is in this case produced in a 28 nm or 32 nm CMOS bulk-substrate technology.

Here again, when W1 is increased relative to a conventional value, the triggering voltage of the triac is reduced.

In a similar way as explained with reference to FIGS. 1 and 2, in 28 nm and 32 nm CMOS technology, a value W1 greater than or equal to 6 microns will be selected, which makes it possible to protect components incorporating thick gate oxide MOS transistors effectively without an external triggering circuit.

In a similar way as described for the structure of FIG. 1, W2$m$ in FIG. 8 denotes the length of the common gate region GH measured parallel to the spacing direction between the two electrodes Zi21 and Zi22 of the two thyristors, and Lgm denotes the dimension of the common gate region measured parallel to the spacing direction between the two sections CSi1 and CSi2.

W2$m$ and Lgm are the minimum dimensions dictated by the design rules (DRM) of the technology in question.

Thus, for a 28 nm CMOS technology, W2$m$ is equal to 0.227 μm and Lgm is equal to 0.325 μm, and the holding voltage VH is of the order of 1.6 V.

For a 32 nm CMOS technology, W2$m$ is equal to 0.26 μm and Lgm is equal to 0.372 μm, and the holding voltage VH is of the order of 1.5 V.

Figure 10:
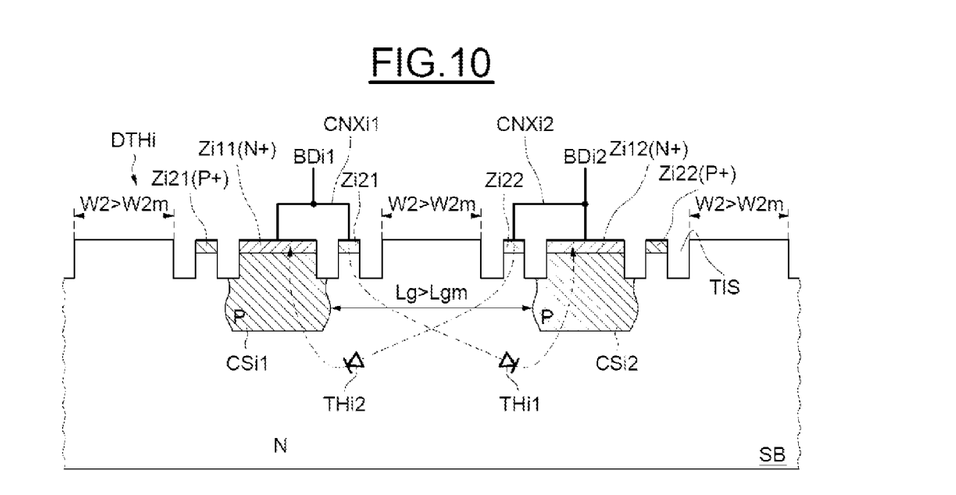

In a similar way as described above for the structure of FIG. 3, when W2 and consequently Lg are increased (FIG. 10), the holding voltage of the triac is increased.

As in the embodiments illustrated in FIGS. 4 to 7, it is possible to insert into this common gate region at least one zone selected from the group formed by a zone having the same conductivity type as the common gate region but doped more heavily than the common gate region, a zone having the opposite conductivity type to the common gate region and optionally doped more heavily than the common gate region, an electrically insulating region.

The holding voltage of the triac can then be increased further.

Examples of such alternative embodiments are illustrated in FIGS. 11 to 14.

Figure 11:
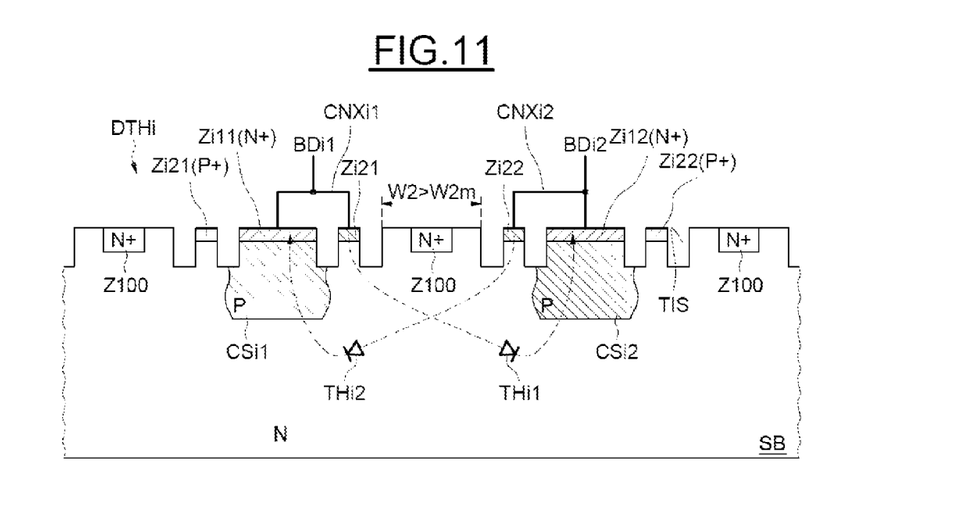

Thus, in FIG. 11, the common gate region comprises an N+ doped zone Z100, that is to say of the same conductivity type as the common gate region but more heavily doped. This zone Z100 surrounds the electrodes Zi21 and Zi22 Here again, such a zone Z100 modifies the acceleration field of the carriers in the direction of braking, which increases the recombination of the minority carriers and contributes to increasing the holding voltage.

Figure 12:
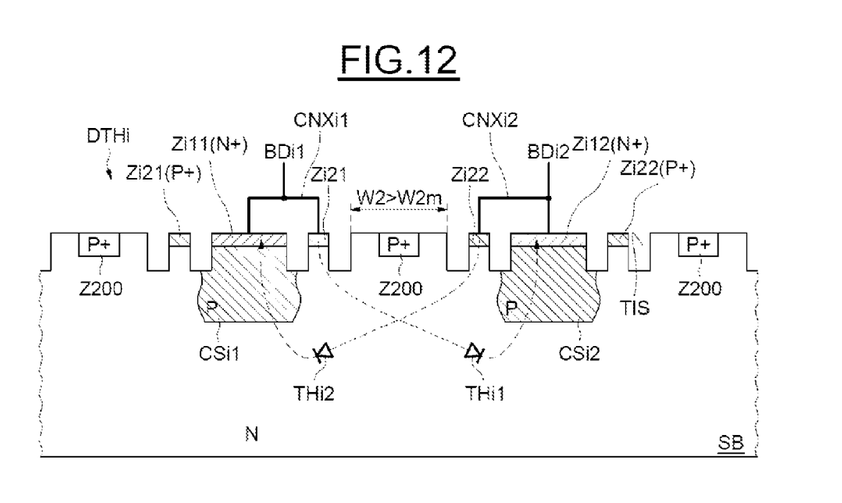

In FIG. 12, the common gate region comprises a P+ doped zone Z200, that is to say of the opposite conductivity type to the common gate region, and here more heavily doped, although the greater nature of the doping is not essential. This zone Z200 surrounds the electrodes Zi21 and Zi22 Here again, such a zone increases the recombination of the minority carriers and contributes to increasing the holding voltage.

Figure 13:
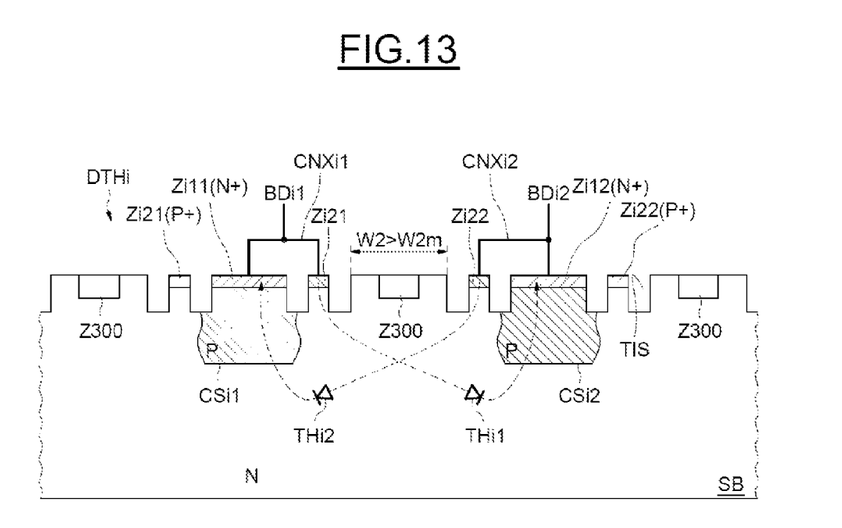

In FIG. 13, the common gate region comprises an insulating zone Z300, for example of the shallow trench type. This zone Z300 surrounds the electrodes Zi21 and Zi22 Here again, such a zone increases the mean free path of the carriers, which increases the recombination of the minority carriers and contributes to increasing the holding voltage.

Figure 14:
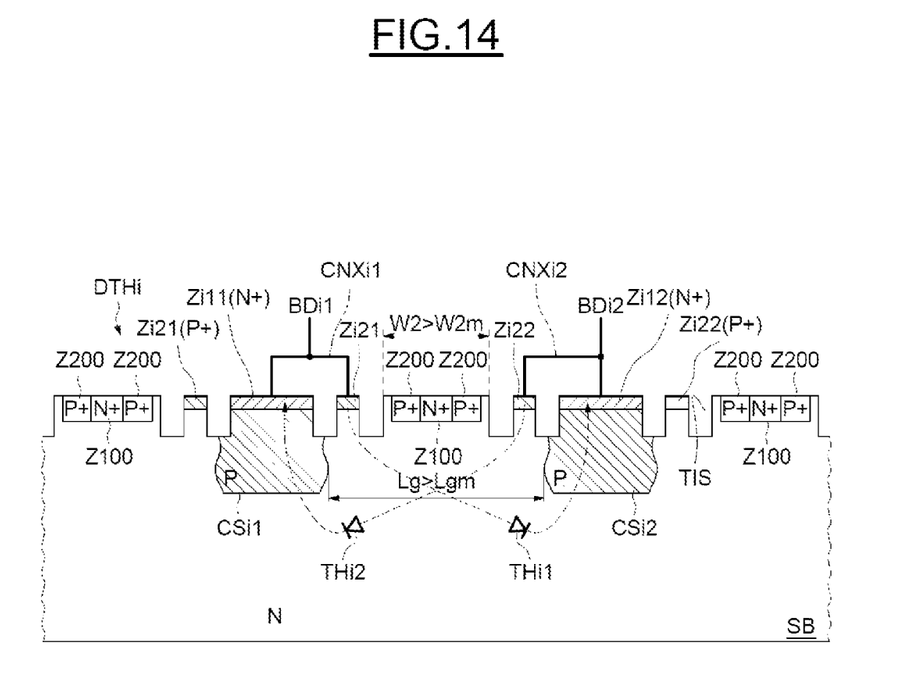

It is also possible, as illustrated in FIG. 14, for the common gate region to comprise three zones selected from the group of zones mentioned above, with two identical zones surrounding a different zone. This makes it possible to combine the effects mentioned above.

More precisely, in FIG. 14 there is a sequence of zones Z200-Z100-Z200.

What is claimed is:

1. An integrated circuit produced on a bulk semiconductor substrate in a given CMOS technology, the integrated circuit comprising:

a component produced in the given CMOS technology and having at least one MOS transistor;

a protective semiconductor device configured to protect the component against electrostatic discharges, the protective semiconductor device comprising a doublet including two thyristors positioned head-to-tail, each thyristor having two electrode regions in common and the two thyristors being coupled in parallel between the two electrode regions, the two thyristors respectively having two separate gates and a common semiconductor gate region;

wherein a product of current gains of transistors of each thyristor are greater than 1;

wherein an intrinsic triggering voltage of the protective semiconductor device is less than a breakdown voltage of the at least one MOS transistor of the component;

wherein each of the two electrode regions comprises a first zone of a first conductivity type and a second zone of a second conductivity type, wherein the first zone physically contacts the second zone and wherein the first zone is positioned beside the second zone along a major surface of the integrated circuit; and wherein the common semiconductor gate region comprises a first insulating zone, a second insulating zone, and a third insulating zone, each of the first insulating zone, the second insulating zone, and the third insulating zone being formed of an insulating material and extending in the common semiconductor gate region between the two electrode regions, a surface of the insulating material of each of the first insulating zone, the second insulating zone, and the third insulating zone being substantially planar with a major surface of the protective semiconductor device, wherein the common semiconductor gate region extends between the first insulating zone and the second insulating zone, and between the first insulating zone and the third insulating zone, and wherein the common semiconductor gate region contacts a bottom surface of the first insulating zone, and wherein the common semiconductor gate region does not directly contact any surface of a vertical sidewall of the first insulating zone.

2. The integrated circuit according to claim 1, wherein each electrode region of one of the two thyristors has a dimension measured perpendicularly to a spacing direction of the two electrode regions, the dimension being adjusted so as to impart the intrinsic triggering voltage that is less than the breakdown voltage of the at least one MOS transistor of the component so that the protective semiconductor device is configured to protect the component against electrostatic discharges without using a triggering circuit, the dimension being greater than or equal to 6 microns.

3. The integrated circuit according to claim 1, wherein each electrode region of the two thyristors has a dimension measured perpendicularly to a line that runs along an interface of the first zone and the second zone of each of the two electrode regions, the dimension further being measured in a direction that is parallel to a major surface of the first zone, the dimension being adjusted so as to impart to the two thyristors respective intrinsic triggering voltages that is less than the breakdown voltage of the at least one MOS transistor of the component.

4. The integrated circuit according to claim 3, wherein the dimension of the electrode regions of one of the two thyristors is different from the dimension of the electrode regions of the other thyristor.

5. The integrated circuit according to claim 2, wherein the given CMOS technology comprises a 28 nm CMOS technology, wherein the dimension is greater than 6 microns, and wherein the at least one MOS transistor comprises a gate oxide having a thickness greater than 3 nanometers.

6. The integrated circuit according to claim 2, wherein the given CMOS technology comprises a 32 nm CMOS technology, wherein the dimension is greater than 6 microns, and wherein the at least one MOS transistor comprises a gate oxide having a thickness of about 6.5 nanometers.

7. The integrated circuit according to claim 2, wherein a dimension of the common semiconductor gate region, measured parallel to the spacing direction, is greater than a minimum dimension defined by design rules of the given CMOS technology.

8. The integrated circuit according to claim 7, wherein the common semiconductor gate region further comprises a third zone and a fourth zone, the third zone and the fourth zone each having an opposite conductivity type to the common semiconductor gate region, the third zone and the fourth zone extending along and contacting opposite sidewalls of the first insulating zone.

9. The integrated circuit according to claim 8, wherein the third zone of the common semiconductor gate region is doped more heavily than the common semiconductor gate region;
wherein a surface of the third zone and a surface of the fourth zone are each substantially planar with a major surface of the protective semiconductor device; and
wherein the common semiconductor gate region extends between the third zone and the second insulating zone, and between the fourth zone and the third insulating zone.

10. The integrated circuit according to claim 1, wherein a virtual straight line that extends in a direction that is parallel to a major surface of the protective semiconductor device sequentially passes through a first electrode region of the two electrode regions, the second insulating zone, the common semiconductor gate region, the first insulating zone, the common semiconductor gate region, the third insulating zone, and a second electrode region of the two electrode regions.

11. The integrated circuit according to claim 1, wherein the common semiconductor gate region extends on a sidewall and a bottom surface of each of the second insulating zone and the third insulating zone.

12. The integrated circuit according to claim 1, wherein a first portion of the common semiconductor gate region that extends between the first insulating zone and the second insulating zone has a surface that is substantially planar with the major surface of the protective semiconductor device; and
wherein a second portion of the common semiconductor gate region that extends between the first insulating zone and the third insulating zone has a surface that is substantially planar with the major surface of the protective semiconductor device.

13. An integrated circuit produced in a given CMOS technology, the integrated circuit comprising:
at least one transistor, the at least one transistor having a breakdown voltage between 6V and 8V; and
a protective semiconductor device, the protective semiconductor device comprising:
a first lower semiconductor zone, a second lower semiconductor zone, and a third lower semiconductor zone on a substrate, wherein the first lower semiconductor zone and the third lower semiconductor zone have a positive conductivity and the second lower semiconductor zone has a negative conductivity, and wherein the second lower semiconductor zone is disposed between the first lower semiconductor zone and the third lower semiconductor zone;
a first upper semiconductor zone and a second upper semiconductor zone over and contacting the first lower semiconductor zone, the first upper semiconductor zone having a negative conductivity and the second upper semiconductor zone having a positive conductivity, the first upper semiconductor zone contacting the second upper semiconductor zone;
a third upper semiconductor zone and a fourth upper semiconductor zone over and contacting the third lower semiconductor zone, the third upper semiconductor zone having a positive conductivity and the fourth upper semiconductor zone having a negative conductivity, the third upper semiconductor zone contacting the fourth upper semiconductor zone;
wherein the protective semiconductor device forms a doublet including two floating gate thyristors coupled in parallel and head-to-tail;
wherein an interface of the first upper semiconductor zone and the second upper semiconductor zone forms a first common electrode of the protective semiconductor device and an interface of the third upper semiconductor zone and the fourth upper semiconductor zone forms a second common electrode of the protective semiconductor device;
wherein the second lower semiconductor zone forms a common semiconductor gate region for the two floating gate thyristors; and
wherein widths of the first upper semiconductor zone, the second upper semiconductor zone, the third upper semiconductor zone and the fourth upper semiconductor zone are configured such that an intrinsic triggering voltage of the protective semiconductor device is lower than a breakdown voltage of the at least one transistor, and the at least one transistor is directly coupled to the first common electrode and the second common electrode of the protective semiconductor device without using a triggering circuit;
wherein the width of the first upper semiconductor zone is a first width, the first width being measured in a direction that is along a major surface of the first upper semiconductor zone and perpendicular to the interface of the first upper semiconductor zone and the second upper semiconductor zone, the width of the third upper semiconductor zone is a second width, the second width being measured in a direction that is along a major surface of the third upper semiconductor zone and perpendicular to the interface of the third upper semiconductor zone and the fourth upper semiconductor zone, and wherein the first width and the second width are each greater than six microns.

14. The integrated circuit according to claim 13, wherein the protective semiconductor device further comprises at least three insulating zones formed of an insulating material extending in the common semiconductor gate region between the first common electrode and the second common electrode, a surface of the insulating material of each of the at least three insulating zones being substantially planar with a surface of the common semiconductor gate region.

15. The integrated circuit according to claim 14, wherein the protective semiconductor device further comprises a first positively charged zone and a second positively charged zone extending in the common semiconductor gate region, a first insulating zone of the at least three insulating zones being disposed between the first positively charged zone and the second positively charged zone.

16. An integrated circuit, comprising a protective semiconductor device, the protective semiconductor device comprising:
   a first semiconductor zone, a second semiconductor zone, and a third semiconductor zone on a substrate, wherein the first semiconductor zone and the third semiconductor zone have a positive conductivity and the second semiconductor zone has a negative conductivity, and wherein the second semiconductor zone contacts the first semiconductor zone and the third semiconductor zone;
   a fourth semiconductor zone and a fifth semiconductor zone over and contacting the first semiconductor zone, the fourth semiconductor zone having a negative conductivity and the fifth semiconductor zone having a positive conductivity, the fourth semiconductor zone contacting the fifth semiconductor zone;
   a sixth semiconductor zone and a seventh semiconductor zone over and contacting the third semiconductor zone, the sixth semiconductor zone having a positive conductivity and the seventh semiconductor zone having a negative conductivity, the sixth semiconductor zone contacting the seventh semiconductor zone;
   a first insulating zone extending in the second semiconductor zone, a second insulating zone extending in the second semiconductor zone, and a third insulating zone extending in the second semiconductor zone, the second semiconductor zone extending between the first insulating zone and the second insulating zone, and between the first insulating zone and the third insulating zone, and wherein the second semiconductor zone contacts a bottom surface of the first insulating zone, and wherein the second semiconductor zone does not directly contact any surface of a first vertical sidewall of the first insulating zone;
   wherein the protective semiconductor device forms a doublet including two floating gate thyristors coupled in parallel and head-to-tail;
   wherein an interface of the fourth semiconductor zone and the fifth semiconductor zone forms a first common electrode of the protective semiconductor device and an interface of the sixth semiconductor zone and the seventh semiconductor zone forms a second common electrode of the protective semiconductor device, and wherein each of the first insulating zone, the second insulating zone, and the third insulating zone are positioned between the first common electrode and the second common electrode;
   wherein the second semiconductor zone forms a common semiconductor gate region for the two floating gate thyristors; and
   wherein widths of the fourth semiconductor zone, the fifth semiconductor zone, the sixth semiconductor zone and the seventh semiconductor zone are configured such that an intrinsic triggering voltage of the protective semiconductor device is lower than a breakdown voltage of at least one transistor, the breakdown voltage of the at least one transistor is in a range of 6V to 8V, and the at least one transistor is directly coupled to the first common electrode and the second common electrode of the protective semiconductor device without using a triggering circuit; and
   wherein the width of the fourth semiconductor zone is a first width, the first width being measured in a direction that is along a major surface of the fourth semiconductor zone and perpendicular to the interface of the fourth semiconductor zone and the fifth semiconductor zone, the width of the sixth semiconductor zone is a second width, the second width being measured in a direction that is along a major surface of the sixth semiconductor zone and perpendicular to the interface of the sixth semiconductor zone and the seventh semiconductor zone, and wherein the first width and the second width are each greater than six microns.

17. The integrated circuit according to claim 16, further comprising a first positively charged zone extending in the second semiconductor zone and a second positively charged zone extending in the second semiconductor zone, wherein a sidewall of the first positively charged zone contacts ft the first vertical sidewall of the first insulating zone, a sidewall of the second positively charged zone contacts a second vertical sidewall of the first insulating zone, and the first vertical sidewall of the first insulating zone is opposite to the second vertical sidewall of the first insulating zone.

* * * * *

UNITED STATES PATENT AND TRADEMARK OFFICE
CERTIFICATE OF CORRECTION

PATENT NO. : 9,991,173 B2
APPLICATION NO. : 14/155891
DATED : June 5, 2018
INVENTOR(S) : Philippe Galy et al.

Page 1 of 1

It is certified that error appears in the above-identified patent and that said Letters Patent is hereby corrected as shown below:

In the Claims

In Column 14, Line 37, Claim 17, delete "ft".

Signed and Sealed this
Fourth Day of September, 2018

Andrei Iancu
*Director of the United States Patent and Trademark Office*